United States Patent [19]
Fontana et al.

[11] Patent Number: 5,982,677
[45] Date of Patent: Nov. 9, 1999

[54] COMPENSATED VOLTAGE REGULATOR

[75] Inventors: Marco Fontana, Milan; Massimo Montanaro, Pavia, both of Italy

[73] Assignee: STMicroelectronics S.r.l., Agrate Brianza, Italy

[21] Appl. No.: 09/163,755

[22] Filed: Sep. 30, 1998

[30] Foreign Application Priority Data

Sep. 30, 1997 [EP] European Pat. Off. .............. 97830484

[51] Int. Cl.$^6$ ................................. G11C 7/00; G05F 3/16
[52] U.S. Cl. ..................................... 365/189.09; 323/313
[58] Field of Search .................................. 323/273, 275, 323/313, 315, 907; 327/535, 538, 540; 330/257, 288; 365/189.02, 189.09, 206, 211, 226, 227

[56] References Cited

U.S. PATENT DOCUMENTS

| | | | |
|---|---|---|---|
| 5,212,458 | 5/1993 | Fitzpatrick et al. | 330/288 |
| 5,220,273 | 6/1993 | Mao | 323/313 |
| 5,602,790 | 2/1997 | Mullarkey | 365/211 |
| 5,815,437 | 9/1998 | Pascucci et al. | 365/189.05 |

FOREIGN PATENT DOCUMENTS

| 661 717 A1 | 7/1995 | European Pat. Off. . |
|---|---|---|
| 93/16427 | 8/1993 | Germany . |

OTHER PUBLICATIONS

European Search Report dated Jun. 29, 1998 with annex on European Application No. 97830484.

*Primary Examiner*—Matthew Nguyen
*Attorney, Agent, or Firm*—Gunster, Yoakley, Valdes-Fauli & Stewart, P.A.; Michael J. Buchenhorner

[57] ABSTRACT

A compensated voltage regulator of the type used in programming non-volatile memory cells of a memory cell matrix that is divided into sectors. The voltage regulator includes a comparator that is connected to a supply voltage. A first input terminal of the comparator is supplied a reference voltage, and a second input terminal is feedback connected to a program line. The control terminal of an output transistor is connected to an output terminal of the comparator, and a conduction terminal of the output transistor is connected to the memory cells by the program line. An output current is passed through a conduction terminal of the output transistor. Further, a compensation circuit is powered by the supply voltage. An input of the compensation circuit is connected to the output terminal of the comparator and to the output transistor, and an output of the compensation circuit is also connected to the output terminal of the comparator. This causes the duplication of a current that is suitably attenuated with respect to the output current and is useful in modifying the output voltage of the comparator.

27 Claims, 3 Drawing Sheets

COMPENSATED VOLTAGE REGULATOR

CROSS-REFERENCE TO RELATED APPLICATIONS

This application is based upon and claims priority from prior European Patent Application No. 97-830484.8, filed Sep. 30, 1997, the entire disclosure of which is herein incorporated by reference.

BACKGROUND OF THE INVENTION

1. Field of the Invention

The present invention relates to voltage regulators, and more specifically to a compensated voltage regulator for biasing the terminals of electrically-programmable non-volatile memory cells.

2. Description of the Related Art

A conventional electrically-programmable non-volatile memory is constructed as matrices of memory cells that each include a floating gate MOS transistor having drain and source regions. The floating gate is formed over the semiconductor substrate and is isolated from the substrate by a thin layer of gate oxide, and a control gate is capacitively coupled through a dielectric layer to the floating gate. Metal electrodes are provided for contacting the drain, source, and control gate terminals to allow predetermined voltages to be applied to the memory cell. A semiconductor integrated circuit non-volatile memory device typically has a very large number of such cells organized into a matrix of rows (or word lines) and columns (or bit lines). All of the memory cells in one word line have a common drive line connected to their control gates, and the memory cells in one bit line have their drain terminals connected in common.

In conventional non-volatile memory cells, the amount of charge present on the floating gate can be varied by suitably biasing the terminals of the cell. Charge is stored on the floating gate through a "programming" operation in which the drain terminal and the control gate are biased to a predetermined voltage that is higher than the voltage at the source terminal. In particular, the programming or writing of an individual memory cell is based on the well-known phenomenon of hot electron injection in which cell programming is enabled by an injection of hot electrons onto the floating gate.

During programming, hot electrons are generated in the channel of the floating gate transistor in proximity to the drain region when there are present electric fields of such strength that the electrons are given a much different mobility than that caused by normal thermal agitation. For such an electron injection to occur, the electrons must be supplied kinetic energy of a greater magnitude than the potential energy existing between the channel and the gate region. This is achieved by biasing the gate and drain terminals of the memory cell at relatively high voltages (e.g., 12.5V and 6.5V, respectively).

Such memory cell biasing involves considerable dissipation of current and it is vital that the memory cell accessing resistors do not produce voltage drops sufficient to degrade the potential of the bias voltage being applied. If such a degradation does occur in non-volatile memory cells of the flash type for example, the reduced potential of the drain voltage Vpd causes an insufficient or slow programming of the memory cell. On the other hand, too large of a potential for the drain voltage Vpd can cause a destructive snap-back phenomena or the memory cell to be soft erased (i.e., become partially erased). Thus, the optimum range for the drain voltage Vpd is fairly limited with variations on the order of 200 mV to 300 mV from the reference potential being typically dictated by the technology. In this respect, the writing rate and snap-back phenomenon respectively set the lower and upper limits of the drain voltage range that is acceptable for proper programming of the memory cell.

In order to insure that programming voltages fall within the required range, conventional memory devices are provided with a sophisticated type of voltage regulator that is adapted to supply the bit lines of the cell matrix with an accurately regulated drain voltage during programming. However, advanced miniaturizing technologies make it increasingly more difficult to provide programming circuitry that is capable of generating the appropriate bias voltages. In particular, reduced width and thickness interconnect lines result in higher resistance for the conduction paths used for applying the drain voltage to the memory cells. Further, the current dissipation of each memory cell increases as a result of reduced oxide thicknesses.

Such problems become even more acute at the testing stage in which multiple memory cells are simultaneously programmed in parallel in order to lower the cost and time of the operation. More specifically, the simultaneous programming causes increased voltage drops across the conduction paths used for accessing the drain terminals of the memory cells. Furthermore, the reduced channel length brought about by the ongoing miniaturization process significantly restricts the permissible range for the drain voltage mainly because of a lowered snap-back voltage.

A number of programming circuits have been proposed to solve the problems described above. According to one solution that is disclosed in European Patent Application No. 93-830545.5, a drain voltage regulator outputs a slightly higher voltage than the voltage desired for the bit line. This voltage difference is instantaneously dependent on the current actually flowing through the bit line select transistors. A voltage regulator of this type is formed through an adaptive bias technique using a positive feedback structure. The feedback structure employs a "central" generator that includes an average voltage drop compensator for the access lines to the cell drains, and the voltage is regulated using a feedback circuit of the cascode-compensator type.

Additionally, in such a regulator, an outer feedback loop also exists so as to modify the system reference voltage according to the output current. Thus, the generator supplies a higher output voltage with larger output currents to compensate for the voltage drop across the memory cell access lines. However, the bias variation caused by the number and location of memory cells being programmed remains quite high. While being somewhat advantageous, such a regulator applies its voltage control operation to the whole of the memory cells and does not allow the high programming parallelism that is necessary to speed up the testing of the memory device.

In a more recent solution that is disclosed in European Patent Application No. 96-830192.9, local drain voltage generators are employed for each output sector of the memory matrix. An example of programming circuitry incorporating local generators for the drain voltage Vpd is shown in FIG. 1, and a more detailed diagram of the programming circuitry is shown in FIG. 2. In the circuitry of FIG. 2, the Vpp line supplies the high voltage (e.g., 12.5V) for the programming operation and is used to generate a reference voltage Vref (e.g., 6.5V by dividing the program voltage Vpp). The reference voltage Vref potential is "duplicated" with low output resistance by multiple drain voltage Vpd generators.

The drain voltage generators are located adjacent to the memory matrix so that the access path to the memory cell drains is much shorter than in device arrangements having a "central" generator and providing long signal distribution paths and transistors for accessing the matrix sectors containing memory cells to be programmed. Furthermore, with this arrangement, the memory cell biasing is not affected by the number and location of the output sectors that are involved in the programming. This advantage also holds true for parallel programming because it is possible to activate several independent paths at the output of each generator by acting on column selection.

The structure used in FIG. 2 includes a negative feedback regulator that can smooth out the output voltage Vyms to close to the reference voltage Vref for even large output currents. The high differential gain of the comparator, the ample dynamic range of its output signal, and the high transconductance of the cascodes ensure regulation even in situations of considerable drift of the technological parameters and degradation of the supply voltage Vpp. Further, a capacitor at the comparator output creates a dominant time constant in the feedback network that prevents overshooting at both the transient and the regulation phases, and enable transistors controlled by a program signal inhibit the generator action when the data to be written into the memory cell is the same as the state of a virgin memory cell.

Although this solution provides such advantages, it may also be unsatisfactory where the resistance downstream of the generators becomes too high. For example, a voltage drop can occur across the whole of Vpp line in a device having very long bit lines or when the current drain of the memory cells is quite large (e.g., in parallel programming). Such an overall voltage drop causes the reference voltages to be degraded and thus results in an unacceptable variation in the programming voltage.

SUMMARY OF THE INVENTION

In view of these drawbacks, it is an object of the present invention to remove the above-mentioned drawbacks and to provide a voltage regulator in which the drain voltage is held constant during the programing of multiple memory cells. A suitably attenuated duplication of the output current is provided and the duplicated current is used to modify the output voltage of a comparator within the regulator. This allows the testing of the memory device to be completed in a shortened period.

One embodiment of the present invention provides a compensated voltage regulator of the type used in programming non-volatile memory cells of a memory cell matrix that is divided into sectors. The voltage regulator includes a comparator that is connected between two supply voltages. A first input terminal of the comparator is supplied a reference voltage, and a second input terminal of the comparator is feedback connected to a program line. The control terminal of an output transistor is connected to an output terminal of the comparator, and a conduction terminal of the output transistor is connected to the memory cells by the program line. An output current is passed through a conduction terminal of the output transistor. Further, a compensation circuit is powered by the first supply voltage. An input of the compensation circuit is connected to the output terminal of the comparator and to the output transistor, and an output of the compensation circuit is also connected to the output terminal of the comparator. This causes the duplication of a current that is suitably attenuated with respect to the output current and is useful in modifying the output voltage of the comparator.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawing.

Figure 1:
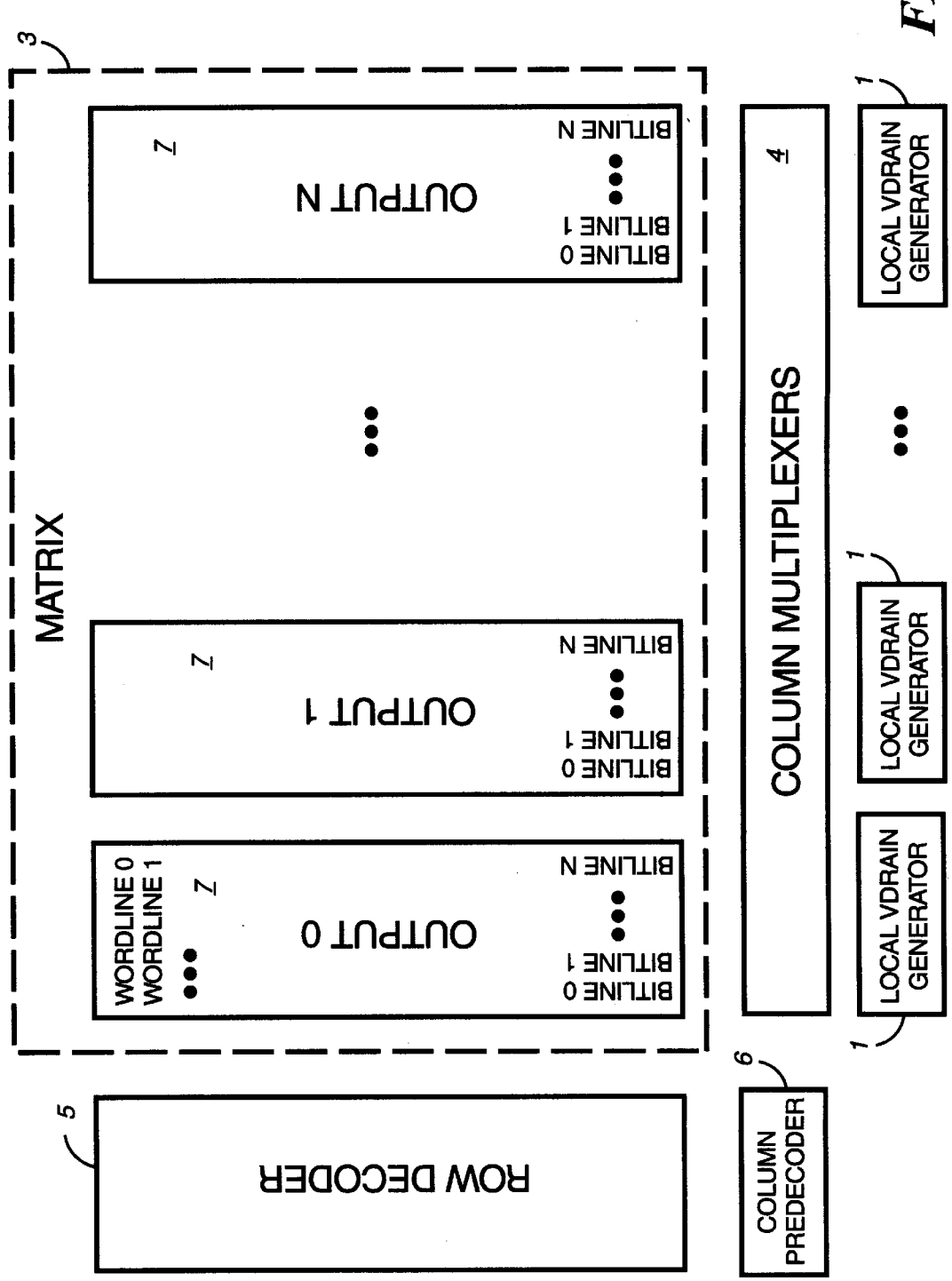
FIG. 1 is a block diagram of programming circuitry for a semiconductor memory device that includes multiple local voltage regulators.
Figure 3:
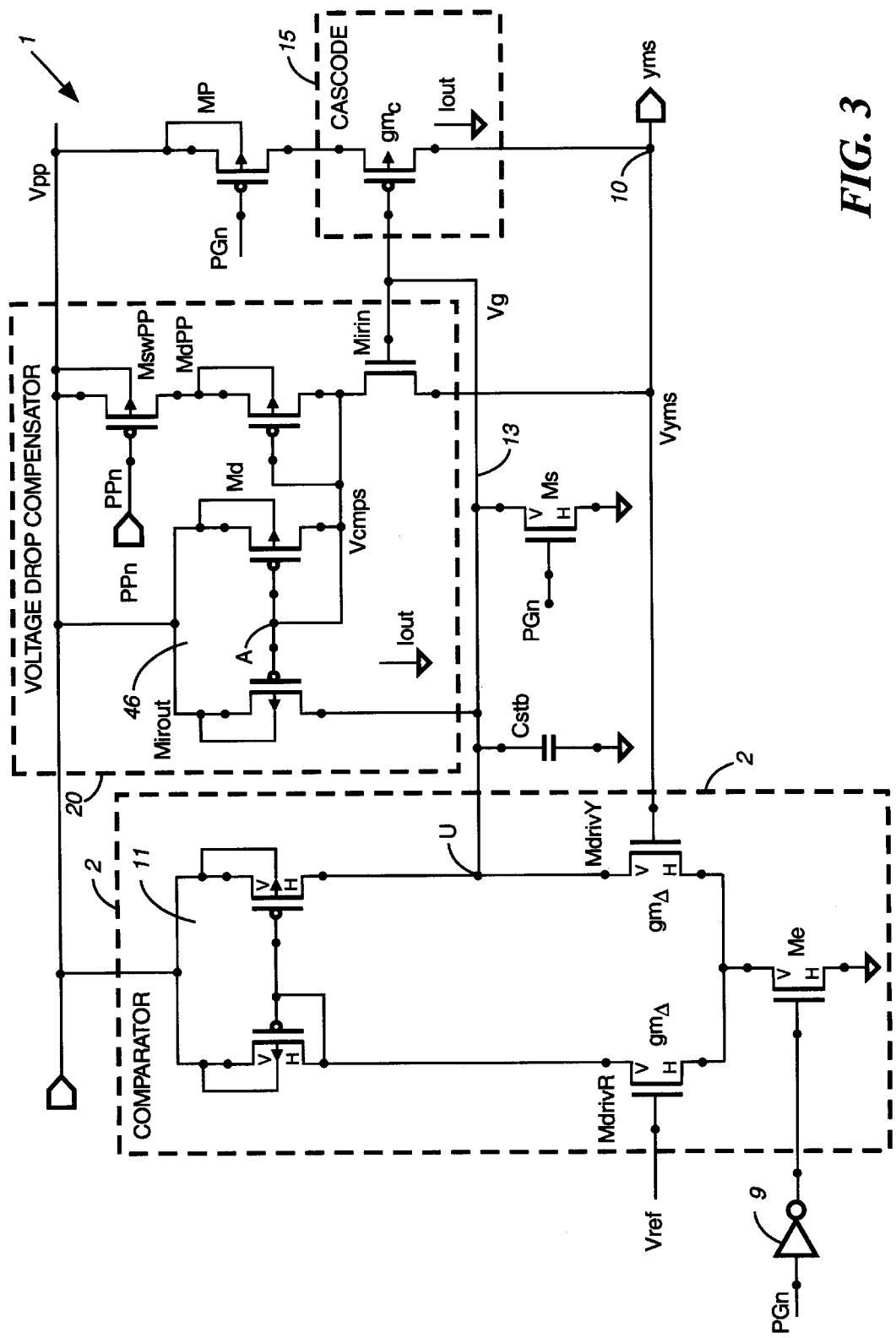
FIG. 3 is a schematic diagram of a voltage regulator according to a preferred embodiment of the present invention.

A voltage regulator according to a preferred embodiment of the present invention is shown in FIG. 3. The voltage regulator 1 is suitable for use in biasing the terminals of electrically erasable and programmable non-volatile memory cells, such as FLASH EEPROM type memory cells. In such a memory, the memory cells are organized into a matrix 3 (FIG. 1) having rows (or word lines) and columns (or bit lines), and all memory cells in one bit line have their drain terminals connected in common. Associated with the matrix 3 are a conventional row decoder 5, a column pre-decoder 6, and column multiplexers 4.

Figure 2:
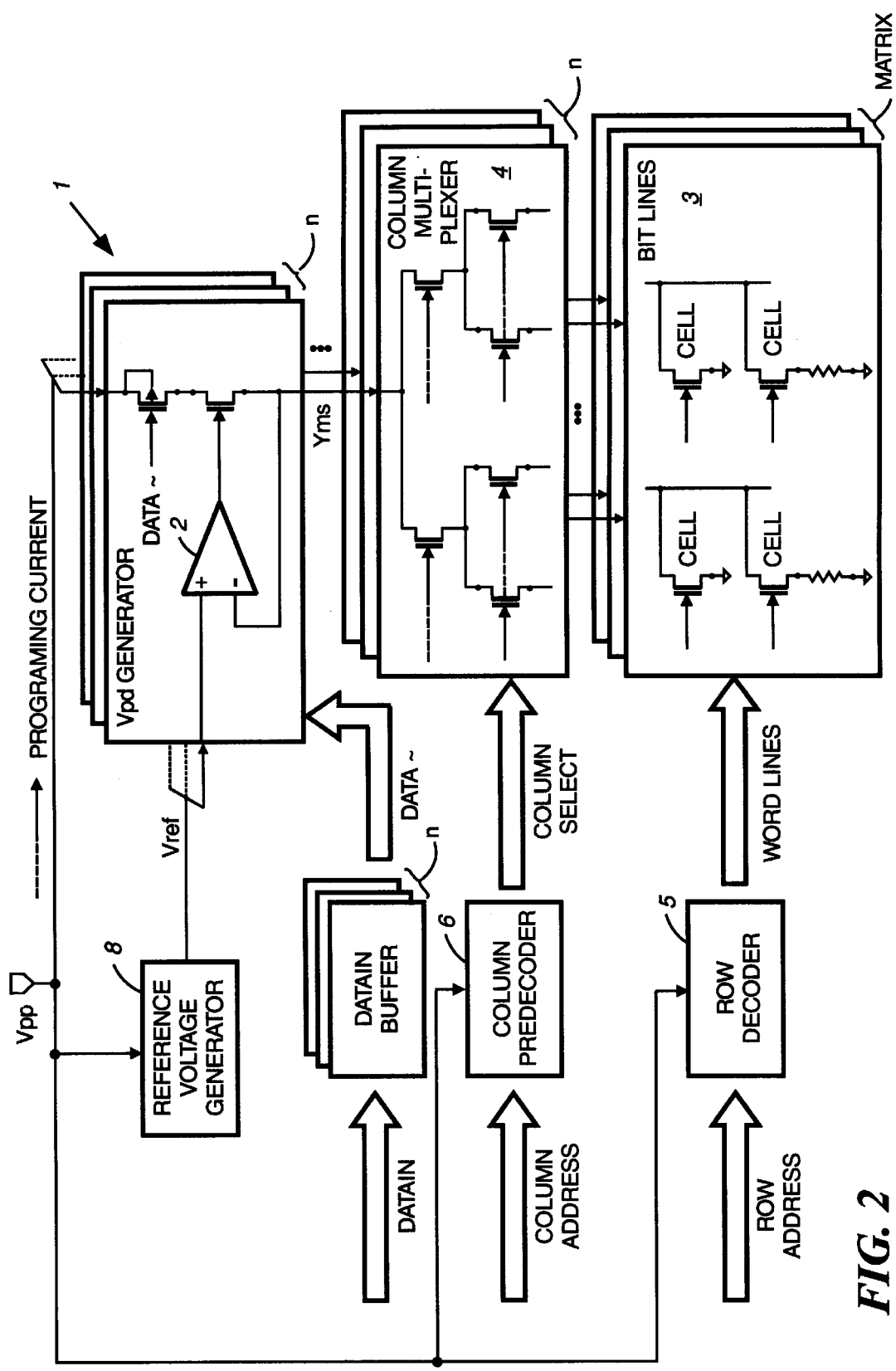
FIG. 2 is a more detailed block diagram of the programming circuitry of FIG. 1.

The voltage regulator 1 is particularly suited for (but not limited to) use with flash memory devices in which the memory cell matrix 3 is divided into N sectors 7 (e.g., a device having sixteen sectors of at least one Mbit each with data words of sixteen bits). In the preferred memory device, a regulator 1 is provided for each sector 7 of the memory matrix 3, and each local regulator is compensated for the output voltage drop. The general programming circuitry with which the regulators 1 are incorporated is illustrated in the substantially conventional circuits of FIGS. 1 and 2. Further, all of the regulators 1 in the memory device have a similar construction so only one regulator is described in detail below.

Each voltage regulator 1 is powered between a first voltage Vpp and a second voltage GND. In the preferred embodiment of FIG. 3, the first voltage Vpp is a programming voltage of about 12.5V that is applied to the word line of the matrix during programming, and the second voltage GND is a signal ground. The regulator 1 includes enable transistors and an operational amplifier 2 that is feedback connected so as to function as a comparator. A first non-inverting input (+) of the comparator 2 receives a reference voltage Vref from a reference voltage generator 8 that divides the programming voltage Vpp. In this embodiment, the comparator 2 is controlled by a programming step enable signal PG.

More specifically, the comparator 2 includes a pair of input MOS transistors MdrivR and MdrivY whose source terminals are connected together and coupled to ground GND through a control transistor Me. An inverter 9 receives a negated programming step enable signal PGn, inverts it, and supplies it to the control terminal of the control transistor Me as the programming step enable signal PG. The comparator 2 is biased in a conventional manner by a current mirror 11 that is connected between the programming voltage Vpp and the pair of input transistors. An output U of the comparator 2 is connected through line 13 to an output switch 15 formed by an NMOS transistor Mcasc that is a high transconductance cascode.

The output U provides a signal Vg that is the outcome of the regulation performed by the comparator 2 as corrected by a compensation block 20 that is described below. The switch transistor Mcasc is coupled to the programming voltage Vpp through a cascode connection with a PMOS transistor MP whose body terminal is connected to the programming voltage Vpp and whose control terminal receives the negated programming step enable signal PGn. The switch transistor Mcasc is also connected to a program line 10, which is connected to the bit lines of the memory matrix.

The programming line 10 is also connected to the second inverting input (−) of the comparator 2 (i.e., the control terminal of the input transistor MdrivY) so as to provide a feedback loop. The connection of the feedback loop to the inverting input of the comparator 2 allows the regulated voltage Vreg to be smoothed in accordance with the current drain from the program line 10. Additionally, a smoothing capacitor Cstb and a discharge transistor Ms are independently connected between the output U of the comparator 2 and ground GND. The control terminal of the discharge transistor Ms receives the negated programming step enable signal PGn.

The construction of the compensation block 20 will now be explained. The compensation block 20 is basically a current mirror and a switch that is activated during a parallel programming operation. A first NMOS transistor Mirin is provided in an input portion of a current mirror 16. The control terminal of the first transistor Mirin is connected to the control terminal of the switch transistor Mcasc of the output switch 15, the source terminal of the first transistor Mirin is connected to the programming line 10, and the drain terminal of the first transistor Mirin is coupled to the programming voltage Vpp through a PMOS load transistor MdPP and a PMOS control transistor MswPP connected in series.

Both the load transistor MdPP and the control transistor MswPP have their body terminal connected toward the voltage supply, and the control terminal of the control transistor MswPP receives a negated signal PPn. The control terminal of the load transistor MdPP is connected to the drain terminal of the first transistor Mirin and to the output portion of the current mirror 16. That is, a circuit node A connects the control terminals of a PMOS output transistor Mirout of the mirror 16 and a second PMOS load transistor Md, the drain terminal of the first transistor Mirin, and the drain terminal of the second load transistor Md. The voltage Vcmps is present at the node A.

Additionally, the source terminals of the output transistor Mirout and the second load transistor Md are connected to the programming voltage Vpp, and the body terminals of these two transistors are connected to their respective source terminals. Thus, these two transistors are configured as diodes. Further, the drain terminal of the output transistor Mirout of the mirror 16 is connected to the output U of the comparator 2. The output transistor Mirout produces a current that is proportional by a parameter α to the output current Iout of the cascode output switch 15.

The operation of the compensation block 20 is based upon a suitably attenuated duplication of the output current Iout and the use of this duplicated current Iout*α to modify the output voltage Vg of the comparator 2. The compensation block 20 overcompensates the output current Iout by driving the cascodes such that the output resistance will be negative. The operation of the compensation block 20 will now be described in greater detail. The first transistor Mirin operates as an input current mirror. That is, because both the first transistor Mirin and the switch transistor Mcasc have similar source and gate biases and are operated in their saturation range, the current dissipated by each is proportional to its dimension ratio. Thus, the cascode current Iout is mirrored with high attenuation, and then the input current to the compensation block 20 is converted to a voltage Vcmps by the second load transistor in its diode configuration.

During parallel programming, the switch MswPP is turned on by the signal PPn and thus, the first load transistor MdPP is connected in parallel to the second load transistor Md. The voltage Vcmps generates a current Iout*α through the output transistor Mirout that is operated in a saturated state. Because the combination of the output transistor Mirout, the second load transistor Md, and the first load transistor MdPP also forms a current mirror, the current exiting from the compensation block 20 is proportional to the cascode current Iout. (The attenuation factor previously indicated as the parameter α.)

The current Iout*α generated by the compensation block 20 alters the balance of currents at the output U of the comparator 2 and increases the voltage Vg at that node. The current balance is restored as the voltage Vyms at the output node OUT of the voltage regulator 1 allows the corresponding input transistor MdrivY of the comparator to take back in the compensation current Iout*α. Assuming that the differential gain of the comparator is infinite, for a given output current Iout the voltage Vyms at the node OUT is given by:

$$Vyms = Vref + (\alpha/gm)*Iout \qquad (1)$$

where gm is the transconductance of the input transistors MdrivR and MdrivY of the comparator.

The compensation factor is arranged (e.g., by appropriately dimensioning the current mirrors) so as to cancel out the effects of the voltage drop across an access line of "standard" type. For memory cells located at the end of such an access line, the following relation applies:

$$Vdrain = Vref \qquad (2)$$

The value of the compensation factor can now be expressed analytically. By using the relation:

$$Vdrain = Vyms - Rdrop*Iout \qquad (3)$$

with Rdrop being the resistance of the line under consideration, the factor is:

$$Vdrain = Vref + (\alpha/gm - Rdrop)*Iout \qquad (4)$$

and therefore:

$$\alpha = Rdrop*gm \qquad (5)$$

The compensation factor α would be modified, as mentioned, in the instance of parallel programming. Using n to denote the number of cells to be programmed using a single voltage regulator 1, the corrected output current to be considered for compensation is given as Iout/n. In accordance with the present invention, this current can be obtained in quite an equivalent manner by reducing the compensation factor α. Thus, the parameter αp to be used for parallel programming is given as αn. In the presence of very large output currents Iout or substantial drops in the programming voltage Vpp, the transistors Mirin and Mirout of the mirror 16 are dimensioned, in the compensation circuitry, to exit their saturation range ahead of the transistors MdrivR and MdrivY of the comparator 2. Thus, under such conditions, the performance of the voltage regulator 1 becomes similar to that of an uncompensated regulator and the instability problems that are typical of all circuits with a negative output resistance are avoided.

The voltage regulator of the present invention overcomes the drawbacks of conventional regulators and provides several advantages. By using the voltage regulator of the present invention, the regulation is always applied locally for each sector of the matrix. This makes the regulation independent of any drop in the supply voltage and of the locations of the various circuit portions being programmed. Memory devices incorporating the voltage regulator of the present invention have an improved writing rate that provides superior efficiency during writing and a shortened testing time. Additionally, the regulator makes possible programming parallelism that is highly useful during memory cell matrix testing, and the parallelism can be enhanced to reduce selection time. Further, the regulator of the present invention involves only limited area and complexity increases over other voltage regulators.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A compensated voltage regulator for use in programming non-volatile memory cells of a memory cell matrix that is divided in sectors, said voltage regulator comprising:

an output transistor connected to at least some of the memory cells by a program line, an output current being passed through a conduction terminal of the output transistor;

a comparator coupled to a first supply voltage and a second supply voltage, the comparator including:
      a first input terminal that receives a reference voltage; and
      a second input terminal connected to the program line; and
      an output terminal connected to the control terminal of the output transistor; and a compensation circuit coupled to the first supply voltage, the compensation circuit having an input that is connected to the output terminal of the comparator and the control terminal of the output transistor, and an output that is connected to the output terminal of the comparator, wherein the compensation circuit generates a current that is proportional to the output current and that is attenuated with respect to the output current by a predetermined amount.

2. The voltage regulator as defined in claim 1, wherein the compensation circuit includes a current mirror circuit, the current mirror including an input transistor that is connected to the output transistor.

3. The voltage regulator as defined in claim 2, wherein the control terminal of the input transistor is connected to the control terminal of the output transistor, and the source terminals of the input transistor and the output transistor are connected to the program line.

4. The voltage regulator as defined in claim 2, wherein the current mirror also includes an output transistor that is coupled to the input transistor through at least one load transistor.

5. The voltage regulator as defined in claim 4, wherein the input transistor and the output transistor of the current mirror are coupled together through at least one pair of load transistors that are connected in parallel.

6. The voltage regulator as defined in claim 4, wherein the input transistor and the output transistor of the current mirror are coupled together through at least one pair of load transistors, the pair of load transistors being selectively connected in parallel by a switch.

7. The voltage regulator as defined in claim 6, wherein the switch is formed by a transistor that is connected between the first supply voltage and one of the load transistors.

8. The voltage regulator as defined in claim 4, wherein the load transistor is configured to act as a diode.

9. The voltage regulator as defined in claim 4, wherein the input transistor and the output transistor of the current mirror are PMOS transistors.

10. The voltage regulator as defined in claim 1, wherein another conduction terminal of the output transistor is coupled to the first supply voltage.

11. A compensated voltage regulator having an input terminal that receives a supply voltage and an output terminal, said voltage regulator comprising:

an output transistor, one conduction terminal of the output transistor being connected to the output terminal of the voltage regulator;

a comparator, a first input terminal of the comparator receiving a reference voltage, a second input terminal of the comparator being connected to the output terminal of the voltage regulator, and an output terminal of the comparator being connected to the control terminal of the output transistor; and a compensation circuit, an input of the compensation circuit being connected to the output terminal of the comparator, and an output of the compensation circuit being connected to the output terminal of the comparator, wherein a first current passes through the one conduction terminal of the output transistor, and a second current is generated from the output of the compensation circuit, the second current being proportional to the first current and being attenuated with respect to the first current by a predetermined amount.

12. The voltage regulator as defined in claim 11, wherein the compensation circuit is connected to the input terminal of the voltage regulator.

13. The voltage regulator as defined in claim 12, wherein another conduction terminal of the output transistor is coupled to the input terminal of the voltage regulator.

14. The voltage regulator as defined in claim 12, wherein the compensation circuit includes:

an output transistor connected between the input terminal of the voltage regulator and the output of the compensation circuit; and an input transistor having one conduction terminal connected to the output terminal of the voltage regulator, another conduction terminal connected to the control terminal of the output transistor of the compensation circuit and coupled to the input terminal of the voltage regulator, and a control terminal connected to the input of the compensation circuit.

15. The voltage regulator as defined in claim 14, wherein the compensation circuit further includes a first load transistor having one conduction terminal coupled to the input terminal of the voltage regulator, another conduction terminal connected to the control terminal of the output transistor of the compensation circuit, and a control terminal connected to the control terminal of the output transistor of the compensation circuit.

16. The voltage regulator as defined in claim 15, wherein the compensation circuit further includes a second load transistor having one conduction terminal connected to the input terminal of the voltage regulator, another conduction terminal connected to the control terminal of the output transistor of the compensation circuit, and a control terminal connected to the control terminal of the output transistor of the compensation circuit.

17. The voltage regulator as defined in claim 16, wherein the first load transistor is coupled to the input terminal of the voltage regulator through a switch transistor, and the control terminal of the switch transistor receives an enable signal.

18. The voltage regulator as defined in claim 17, wherein another conduction terminal of the output transistor is coupled to the input terminal of the voltage regulator.

19. The voltage regulator as defined in claim 11, wherein the compensation circuit includes a current mirror circuit, the current mirror including an input transistor that is connected to the output transistor.

20. The voltage regulator as defined in claim 19, wherein the control terminal of the input transistor is connected to the control terminal of the output transistor, and one conduction terminal of the input transistor is connected to the output terminal of the voltage regulator.

21. A semiconductor memory device comprising:

a matrix of non-volatile memory cells that are divided into sectors; and a plurality of voltage regulators, each of the voltage regulators being coupled to one of the sectors of memory cells in the matrix, wherein at least one of the voltage regulators includes:
an output transistor, one conduction terminal of the output transistor being connected to a programming line;

a comparator, a first input terminal of the comparator receiving a reference voltage, a second input terminal of the comparator being connected to the programming line, and an output terminal of the comparator being connected to the control terminal of the output transistor; and a compensation circuit, an input of the compensation circuit being connected to the output terminal of the comparator, and an output of the compensation circuit being connected to the output terminal of the comparator, wherein a first current passes through the one conduction terminal of the output transistor, and a second current is generated from the output of the compensation circuit, the second current being proportional to the first current and being attenuated with respect to the first current by a predetermined amount.

22. The memory device as defined in claim 21, wherein the compensation circuit of the voltage regulator includes:

an output transistor connected between the supply voltage and the output of the compensation circuit; and an input transistor having one conduction terminal connected to the programming line, another conduction terminal coupled to the supply voltage, and a control terminal connected to the input of the compensation circuit.

23. The memory device as defined in claim 22, wherein the compensation circuit of the voltage regulator further includes a first load transistor coupled between the supply voltage and the control terminal of the output transistor of the compensation circuit.

24. The memory device as defined in claim 23, wherein the compensation circuit of the voltage regulator further includes a second load transistor connected between the supply voltage and the control terminal of the output transistor of the compensation circuit.

25. The memory device as defined in claim 24, wherein the first load transistor of the compensation circuit is coupled to the supply voltage through a switch transistor, and the control terminal of the switch transistor receives an enable signal.

26. The memory device as defined in claim 25, wherein another conduction terminal of the output transistor of the voltage regulator is coupled to the supply voltage.

27. The memory device as defined in claim 21, wherein the compensation circuit of the voltage regulator includes an input transistor that is connected to the output transistor, the control terminal of the input transistor is connected to the control terminal of the output transistor, and one conduction terminal of the input transistor is connected to the programming line.

* * * * *